(12) United States Patent
Kuklinski et al.

(10) Patent No.: US 10,880,986 B2
(45) Date of Patent: Dec. 29, 2020

(54) ACTIVATE LOADING MECHANISM

(71) Applicant: Intel Corporation, Santa Clara, CA (US)

(72) Inventors: Evan Piotr Kuklinski, North Plains, OR (US); Jerrod Peterson, Hillsboro, OR (US); Ruander Cardenas, Hillsboro, OR (US); Patrick Douglas James, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/370,506

(22) Filed: Mar. 29, 2019

(65) Prior Publication Data
US 2019/0246488 A1 Aug. 8, 2019

(51) Int. Cl.
*F03G 7/06* (2006.01)
*H05K 1/02* (2006.01)
(Continued)

(52) U.S. Cl.
CPC .......... *H05K 1/0203* (2013.01); *H05K 1/181* (2013.01); *F28F 2013/006* (2013.01);
(Continued)

(58) Field of Classification Search
CPC ................ H05K 1/0203; H05K 1/181; H05K 2201/10159; H05K 2201/10265; H05K 2201/10378; H05K 2201/10409; H05K 2201/10734; H05K 2201/066; H05K 7/2039; H05K 1/0201; H05K 1/0204; H05K 2201/0308; H05K 5/0008; F28F 2013/006;
(Continued)

(56) References Cited

U.S. PATENT DOCUMENTS 6,672,892 B2 * 1/2004 Chandran ............ H05K 7/1061
361/710
2003/0097839 A1 * 5/2003 Yazawa ................... F03G 7/065
60/527
(Continued)

FOREIGN PATENT DOCUMENTS

EP      0334708 A1    9/1989
FR      2880192 A1    6/2006
WO      2006070121 A1 7/2006

OTHER PUBLICATIONS

European Extended Search Report issued in EP Application No. 20 154 196.8 dated Jul. 21, 2020; 51 pages.
(Continued)

*Primary Examiner* — Mandeep S Buttar
(74) *Attorney, Agent, or Firm* — Patent Capital Group

(57) ABSTRACT

Particular embodiments described herein provide for an electronic device that can be configured to enable an active loading mechanism. The electronic device can include a printed circuit board, a heat source located on the printed circuit board, and an active loading mechanism secured to the printed circuit board. The active loading mechanism is over the heat source and includes shape memory material. When the shape memory material is not activated, the active loading mechanism applies a first load on the heat source and when the shape memory material is activated, the active loading mechanism applies a second load on the heat source.

12 Claims, 13 Drawing Sheets

(51) Int. Cl.
*H05K 1/18* (2006.01)
*F28F 13/00* (2006.01)

(52) U.S. Cl.
CPC .......... *H05K 2201/066* (2013.01); *H05K 2201/10159* (2013.01); *H05K 2201/10265* (2013.01); *H05K 2201/10378* (2013.01); *H05K 2201/10409* (2013.01); *H05K 2201/10734* (2013.01)

(58) Field of Classification Search
CPC . H01L 2924/0002; H01L 23/40; H01L 23/36; H01L 23/367; H01L 23/373; H01L 23/4093; H01L 2023/405; G06F 1/20; G06F 1/206
USPC .......... 361/710, 719, 704, 709, 679.54, 708; 257/E23.084, E23.086, E23.102; 165/80.2, 81
See application file for complete search history.

(56) References Cited

U.S. PATENT DOCUMENTS

| | | | |
|---|---|---|---|
| 2005/0277324 A1* | 12/2005 | Gates | G06F 1/183 439/487 |
| 2010/0129648 A1* | 5/2010 | Xu | H01L 23/4275 428/339 |
| 2019/0004603 A1* | 1/2019 | Longo | G06F 1/1684 |
| 2020/0229318 A1 | 7/2020 | Grau et al. | |

OTHER PUBLICATIONS

USPTO Non-Final Office Action dated Sep. 3, 2020 in U.S. Appl. No. 16/832,576; 29 pages.

* cited by examiner

ACTIVATE LOADING MECHANISM

TECHNICAL FIELD

This disclosure relates in general to the field of computing and/or device cooling, and more particularly, to an activate loading mechanism.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
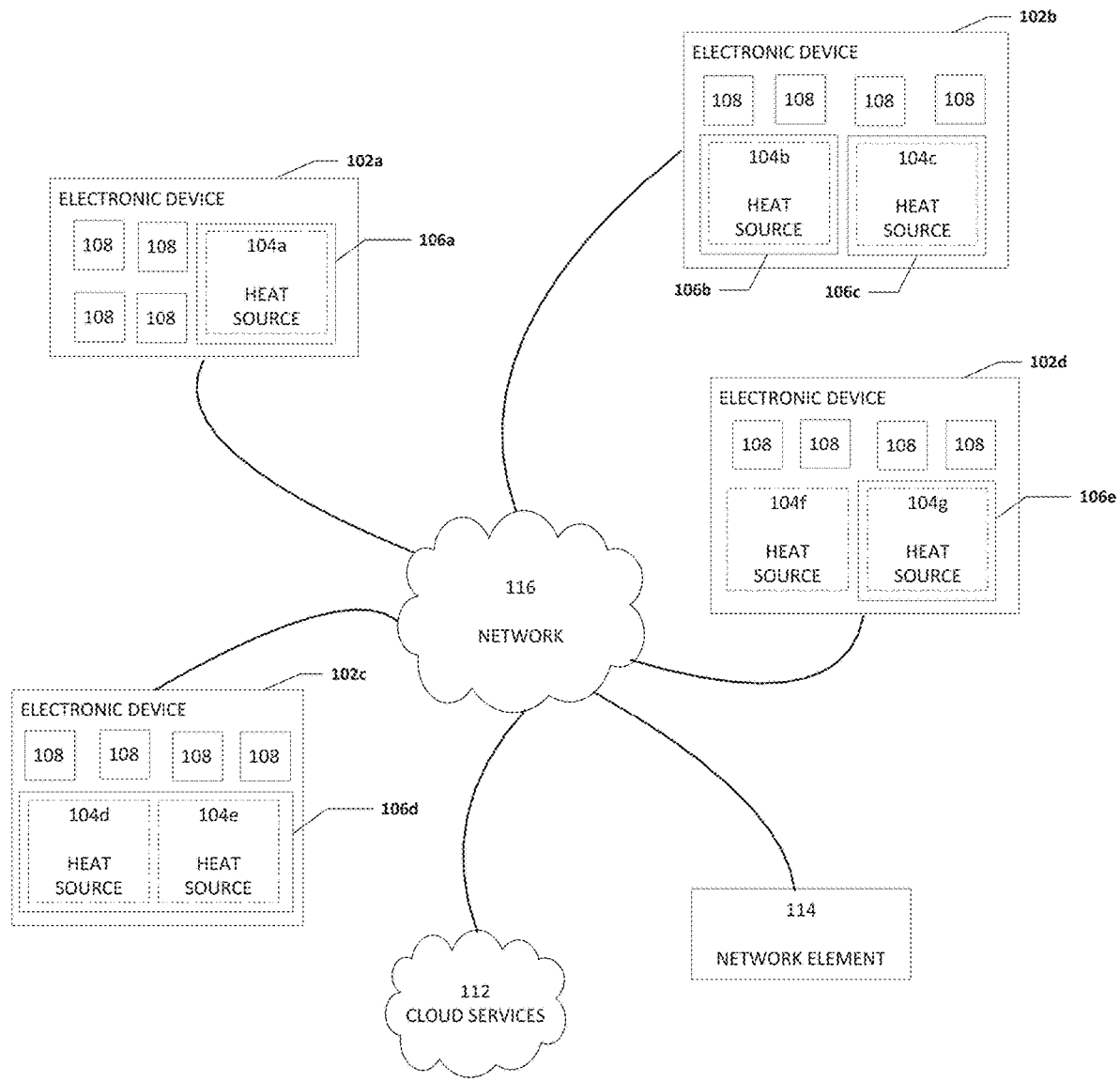
FIG. 1 is a simplified block diagram of a system to enable an active loading mechanism, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling an active loading mechanism. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

FIG. 1 is a simplified block diagram of an electronic device configured with an active loading mechanism, in accordance with an embodiment of the present disclosure. In an example, an electronic device can include one or more heat sources. Each of the one or more heat sources may have a corresponding active loading mechanism. For example, as illustrated in FIG. 1, electronic device 102a includes heat source 104a, a corresponding activate loading mechanism 106a, and one or more electronics 108. In addition, electronic device 102b includes heat sources 104b and 104c, corresponding active loading mechanisms 106b and 106c respectively, and one or more electronics 108. Also, electronic device 102c includes heat sources 104d and 104e, active loading mechanism 106d, and one or more electronics 108. Active loading mechanism 106d can correspond to both heat sources 104d and 104e. Further, electronic device 102d includes heat sources 104f and 104g, active loading mechanism 106e, and one or more electronics 108. Heat source 104f may not have a corresponding active loading mechanism and active loading mechanism 106e may correspond to heat source 104g. Each of electronic devices 102a-120d may be in communication with each other, cloud services 112, and/or network element 114 using network 116. In some examples, one or more of electronic device 102a-102d may be standalone devices and not connected to network 116 or another device.

Each of heat sources 104a-104g may be a heat generating device (e.g., processor, logic unit, field programmable gate array (FPGA), chip set, integrated circuit (IC), a graphics processor, graphics card, battery, memory, or some other type of heat generating device). Each of active loading mechanisms 106a-106e can be configured as a thermal cooling device to help remove thermal energy from one or more corresponding heat sources (e.g., active loading mechanism 106a corresponds to heat source 104a, active loading mechanism 106d corresponds to both heat sources 104d and 104e, etc.). Each of active loading mechanisms 106a-106e may be a passive cooling device or an active cooling device to help reduce the thermal energy or temperature of one or more corresponding heat sources. Each of electronics 108 can be a device or group of devices available to assist in the operation or function of the electronic device that includes electronics 108.

In an example, an active loading mechanism (e.g., active loading mechanism 106a) can be coupled to a heat source (e.g., heat source 104a) such that when the thermal characteristics of the heat source reach a threshold, a shape memory material in the active loading mechanism is activated and changes shape. The shape change of the shape memory material can create an applied load to the heat source and/or the structure that supports the heat source. The applied load can allow the system to help draw heat or thermal energy away from the heat source and cool the heat source.

In a specific example, the heat source may be an integrated circuit (IC) on a printed circuit board (PCB). The active loading mechanism can include a shape memory material and a heatsink that can apply a load on the heat source in response to applied heat or an applied electrical current. When the heat or electrical current is applied, the shape memory material changes shape and pushes the active loading mechanism onto the heat source. The load that is applied is based on the material used and depends on the form factor of the device that includes the active loading mechanism. The load may be one pound of load or less to more than one hundred pounds of load and depends on the shape memory material used, form factor, design constraints, etc.

In an example, the activate loading mechanism can use the shape memory material to help rigidly secured the heat source to the PCB such that oscillations in displacement of the active loading mechanism, heat source, and PCB are reduced and the coupling of the active loading mechanism, heat source, and PCB can withstand shocks and vibrations. In other examples, when activated, active loading mechanism 106 can secure a heatsink to the heat source during the manufacturing process and/or post production.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. Further, the appearances of the phrase "in one example" or "in an example" are not necessarily all referring to the same examples.

Elements of FIG. 1 may be coupled to one another through one or more interfaces employing any suitable connections (wired or wireless), which provide viable pathways for network (e.g., network 116, etc.) communications. Additionally, any one or more of these elements of FIG. 1 may be combined or removed from the architecture based on particular configuration needs. Network 116 may include a configuration capable of transmission control protocol/Internet protocol (TCP/IP) communications for the transmission or reception of packets in a network. Each of electronic devices 102*a*-102*d* may also operate in conjunction with a user datagram protocol/IP (UDP/IP) or any other suitable protocol where appropriate and based on particular needs.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems.

For example, recent performance gains in high-performance mobile client systems have relied heavily on the use of short-duration, high-power burst workloads. The transient nature of these power level two (PL2) spikes makes it more critical than ever to minimize the thermal resistance between a heat source and an associated thermal solution because often other thermal solution components (e.g., heat exchangers, fans, etc.) are too far away from the heat source to make a meaningful difference at the required timescale. Disaggregation and die-partitioning exacerbate this challenge, specifically when two or more high-power or high-power-density dies/chiplets are located immediately adjacent to each other. Independent die/chiplet heights vary on the order of 10-20 μm and the varying height can critically alter the achievable thinness and uniformity of thermal interface material (TIM). More specifically, an about thirty (30) micrometers (μm) TIM thickness is generally preferred but traditional cold plates and loading mechanisms cannot conform to a stepped or irregular SoC surface. Generally, TIM thermal resistance is reduced by increasing the thermal solution load/pressure on the SoC. However, ultra-thin consumer form factors are driving the need for high-performance SoCs on extremely thin motherboards (down to 0.5 millimeters (mm)), which can bend more under traditional thermal solution loads and, as a result, exhibit an unacceptably high occurrence of ball grid array (BGA) solder joint failure. PL2 and disaggregation thermal challenges require minimal resistance at the SoC interface but cannot be solved for ultra-thin 0.5 mm boards by simply increasing the thermal solution load.

One current way transient thermal performance targets are typically achieved is by decreasing the thermal resistance between the SoC and the thermal solution. The thermal resistance between the SoC and the thermal solution is typically decreased by either increasing the thermal solution load on the SoC, which can increase the BGA solder joint failure risk, or by using a TIM that exhibits reduced thermal resistance for the same pressure, which may be nearing a point of diminishing returns for state-of-the-art grease TIMs, and/or can be cost-prohibitive for high volume manufacture for fundamentally new classes of TIMs (e.g., liquid metal). In addition, another currently used means the transient thermal performance targets may be achieved is by increasing the thermal capacitance of the system in the vicinity of the SoC. The Increase in the thermal capacitance of the system in the vicinity of the SoC is typically achieved by increasing the thickness of a cold plate or spreader, which can have a direct impact on the overall system thickness. However, these current solutions generate a constant load on the SoC during all operating conditions. What is needed is a system and method to increase the thermal load on a heat source when needed and decrease the thermal load when it is not needed so as to help preserve the integrity of the SoC, especially the solder ball array.

A system to enable an active loading mechanism, as outlined in FIG. 1, can resolve these issues (and others). In an example, an active loading mechanism can be constructed using a shape memory material. The shape memory material can enable the use of the heat from the heat source or an electrical signal to trigger a reversible shape change of the shape memory material in the active loading mechanism. The shape change of the shape memory material in the active loading mechanism can allow for an increase or decrease in the heatsink load on the heat source. In essence, the shape memory material functions as a mechanical throttle, temporarily increasing the heatsink load on the heat source, and thereby increasing the heat flux out of the heat source during periods of high workload and later decreasing the heatsink load on the heat source when the workload subsides. More generally, the active loading mechanism can encompass a wide class of devices that can be designed to use external or resistive heating and to attach thermal solutions to SoCs and/or to control the thermal solution load once it is assembled. By applying a high thermal solution load when most warranted, the cumulative period of high force/pressure is minimized, decreasing the risk of BGA solder joint failure and enabling higher PL2 values on ultra-thin boards. The active loading mechanism by itself does not increase overall system thickness and can be implemented using current spring geometries that are found in most current thermal solutions (e.g., leaf springs, coil springs, clips, etc.).

The use of shape memory material to create the activate loading mechanisms encompasses a wide array of instantiations.

One shared trait among most current thermal solution systems is that the thermal solution itself is designed to generate a constant load on the SoC during all operating conditions of the device. By contrast, the active loading mechanism can introduce the ability to adjust the heatsink load on the heat source up or down in response to temporary spikes in temperature at specific locations. This enables system designers to implement a deliberate, tuned balance between transient thermal needs and long-term product reliability. The tuning can occur by virtue of the shape memory effect (SME) or shape memory "temperatures" that are selected for the shape memory material.

The SME occurs at an "$A_F$" temperature, which is controlled via small changes in material composition. The $A_F$ can be set anywhere from about −20° C. to 110° C., with a tolerance of ±1° C. The heat source itself is thus a feasible heat source to activate the shape memory material.

One type of shape memory material is Nickel-Titanium alloy ("Nitinol"). During the SME, Nitinol transforms from a martensitic phase to an austenitic phase. This change starts at the $A_s$ temperature and is completed at the $A_F$ or "transition" temperature. Due to this phase change, the Young's modulus increases by a factor of around 2.5×. In a specific example, a thermal solution for a thin, mobile client system uses four dedicated leaf springs as a loading mechanism. The heat source loading can be achieved by using a typical leaf spring size at two common thicknesses and the resulting load increases when the spring is heated and transforms from martensite to austenite. The increases (from about 5 lbf to about 12 lbf and from around 3 lbf to about 7 lbf) can be configured to fall in the load ranges needed to balance the competing demands of PL2 thermal challenges with thin board BGA solder joint reliability.

Traditional grease TIMs have been known to "pump out" of the interface between the die and the thermal solution during conditions of extreme temperature cycling, causing a catastrophic increase in thermal resistance. This phenomenon is difficult to predict analytically and is thought to occur due to a mismatch between the coefficients of thermal expansion (CTE) for the various materials in the design (e.g., copper cold plate, polymer TIM, silicon die, laminate substrate, solder BGA, etc.). As a result, grease TIMs may not be well-suited for use with the active loading mechanism. However, other classes of commercial, high-performance TIMs exist that do not exhibit this failure mode, such as curing polymer TIMs and metal foil TIMs.

In an example when the active loading mechanism is used during a manufacturing process, the active loading mechanism may be directly attached to an SoC package and eliminate the need for through-holes in the main system board, allowing for narrower system boards and thus permitting larger battery volume. The active loading mechanism can be implemented as part of the SoC package and allows for the ability to control the load independently of customer thermal solution design. Resistive heating permits automated assembly of the thermal solution by switching on an applied circuit that activates the shape memory material load mechanism. This also permits a thermal solution load that can be controlled or updated by software settings. Screws as part of the thermal attachment can be eliminated and the active loading mechanism may naturally generate more uniform loading, by eliminating the sequential nature of screw tightening, which can limit thermal solution tilt during system assembly and the associated die crack risk.

Turning to the infrastructure of FIG. 1, network 116 represents a series of points or nodes of interconnected communication paths for receiving and transmitting packets of information. Network 116 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 116, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102a-102d are meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes a heat source. Each of electronic devices 102a-120d may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102a-120d may include virtual elements.

In regards to the internal structure, each of electronic devices 102a-120d can include memory elements for storing information to be used in the operations outlined herein. Each of electronic devices 102a-120d may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

Additionally, each of heat sources 104a-104g may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2A:
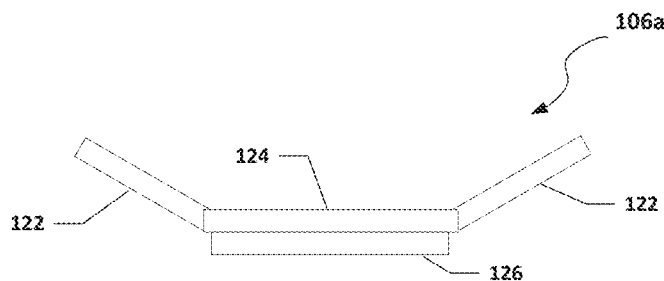
FIG. 2A is a simplified block diagram of a portion of a system to enable an active loading mechanism, in accordance with an embodiment of the present disclosure.

Turning to FIG. 2A, FIG. 2A is a simplified block diagram of activate loading mechanism 106a. As illustrated in FIG. 2A, active loading mechanism 106a can include extensions 122, a main body 124, and a heatsink 126. Extensions 122 and main body 124 can be comprised of shape memory material. In an example, extensions 122 are comprised of shape memory material and main body 124 is comprised of a different material. Active loading mechanism 106a can have a memory shape where extensions 122 from a main body 124 are biased upwards (the shape illustrated in FIG. 2A). When active loading mechanism 106a is deformed (e.g., as illustrated in FIGS. 2C and 3A) and then heated, active loading mechanism 106a will try to return to the shape illustrated in FIG. 2A.

Figure 2B:
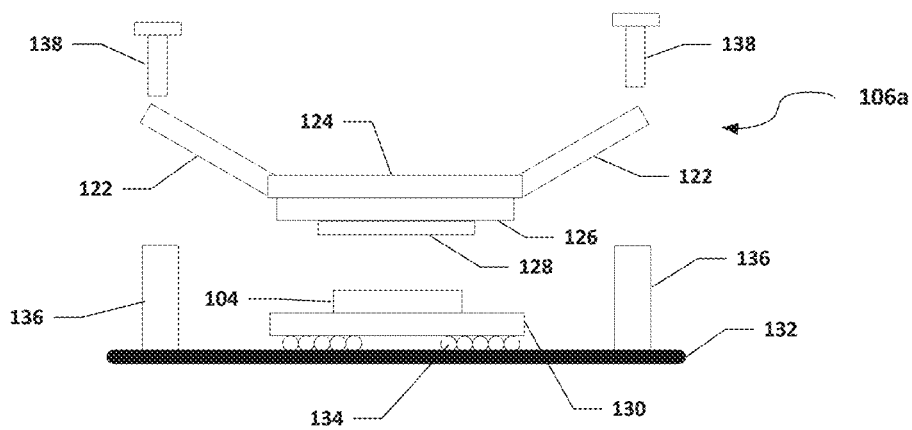
FIG. 2B is a simplified block diagram of a portion of a system to enable an active loading mechanism, in accordance with an embodiment of the present disclosure.
Figure 2C:
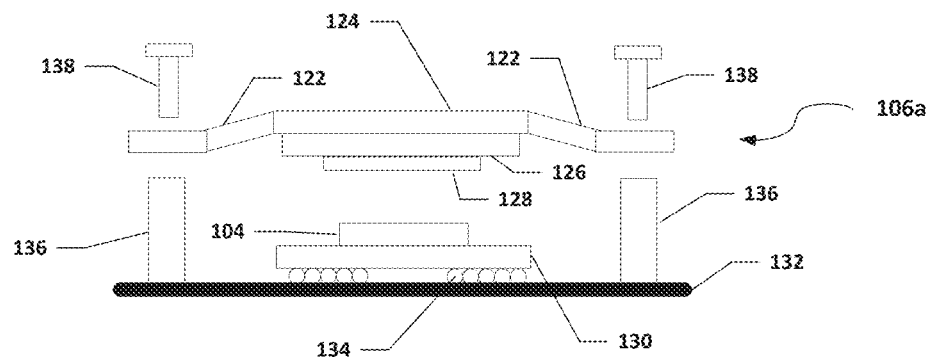
FIG. 2C is a simplified block diagram of a portion of a system to enable an active loading mechanism, in accordance with an embodiment of the present disclosure.

Turning to FIGS. 2B and 2C, FIGS. 2B and 2C are a simplified block diagram of activate loading mechanism 106a being secured to heat source 104. A TIM 128 can be applied under heatsink 126. In some examples, TIM 128 can have a thickness of about thirty (30) µm. Heat source 104 can be over a substrate 130. Substrate 130 can be coupled to a PCB 132 using one or more solder balls 134 or some other means to couple substrate 130 to PCB 132. PCB 132 can include secure posts 136. Secure posts 136 can couple with securing mechanisms 138 to help secure active loading mechanism 106 (and heatsink 126) over heat source 104.

Figure 3A:
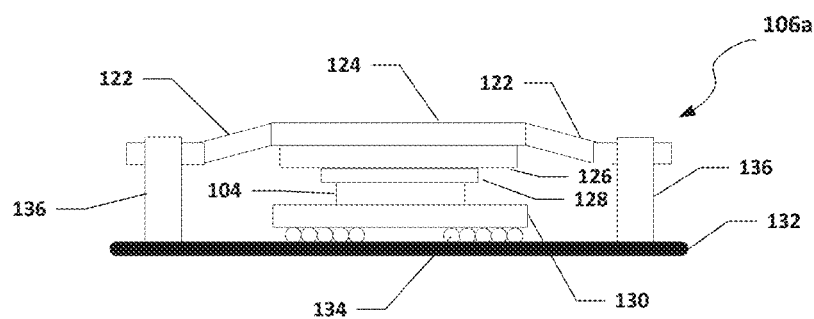
FIG. 3A is a simplified block diagram of a system to enable an active loading mechanism, in accordance with an embodiment of the present disclosure.

Turning to FIG. 3A, FIG. 3A is a simplified block diagram of active loading mechanism 106a coupled to heatsink 126. In an example, heatsink 126 can be over heat source 104 with a TIM 128 between heatsink 126 and heat source 104. Heat source 104 can be on a substrate 130. Substrate 130 be coupled to PCB 132 using solder balls 134. During device assembly, active loading mechanism 106a can be configured (e.g., deformed) to generate a relatively low load on heatsink 126 and heat source 104. The relatively low load helps to reduce stress on heat source 104, TIM 128, substrate 130, PCB 132, and/or solder balls 134 and can help to reduce solder joint failure.

Figure 3B:
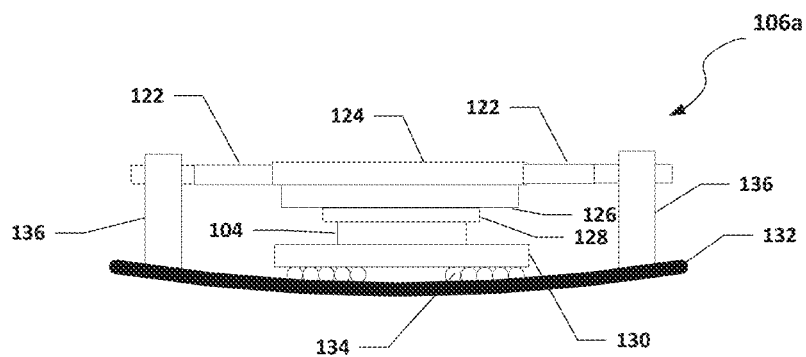
FIG. 3B is a simplified block diagram of a system to enable an active loading mechanism, in accordance with an embodiment of the present disclosure.

Turning to FIG. 3B, FIG. 3B is a simplified block diagram of active loading mechanism 106a coupled to heatsink 126. In an example, active loading mechanism 106a allows for an enabling load on heat source 104 during peak performance times or when a temperature of heat source 104 satisfies a threshold.

More specifically, during peak performance times or when a temperature of heat source 104 satisfies a threshold, a shape change of activate loading mechanism 106a is triggered. The shape change is caused by the shape memory material in activate loading mechanism 106a that changes shape at a specific temperature (a selectable property of shape memory material). The specific temperature that activates the shape memory material can be heat from heat source 104. As activate loading mechanism 106a attempts to revert to its programmed shape (illustrated in FIG. 2A), activate loading mechanism 106a is constrained by the attachments at secure posts 136 and causes a temporary bending of PCB 132 and temporarily increase of the heatsink load on heat source 104 and of the stress on TIM 128, substrate 130, PCB 132, and/or solder balls 134. The force pushing down on heatsink 126 and heat source 104 and the force pulling up or bending PCB 132 causes a pressure increase between heatsink 126 and heat source 104 and allows heatsink 126 to draw more thermal energy from heat source 104 and to help cool heat source 104.

Figure 4A:
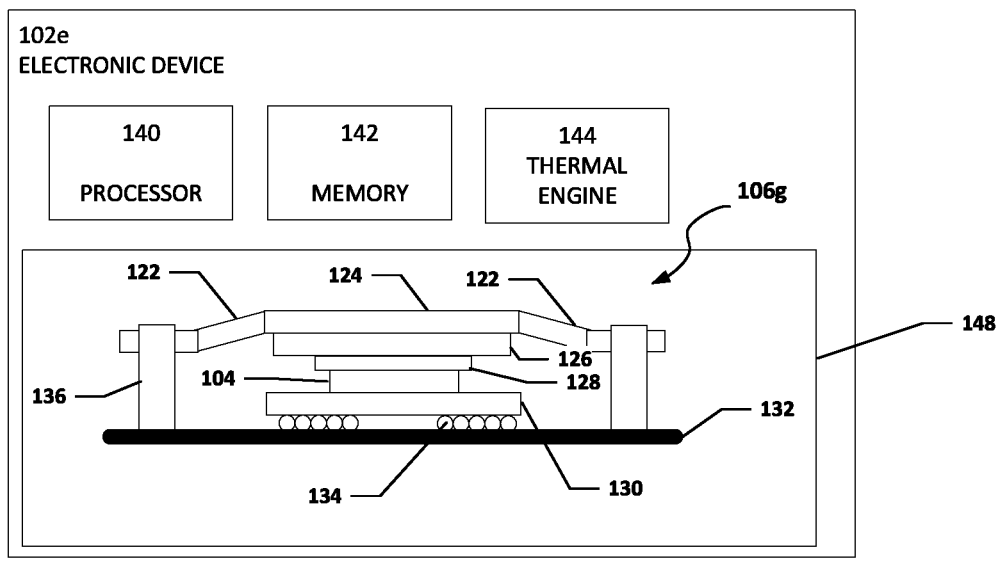
FIG. 4A is a simplified block diagram of a system to enable an active loading mechanism, in accordance with an embodiment of the present disclosure.

Turning to FIG. 4A, FIG. 4A is a simplified block diagram of an electronic device 102e. Electronic device 102e can include a processor 140, memory 142, a thermal engine 144, and one or more electronic components 148. Each electronic component 148 can include an active loading mechanism 106g that includes heatsink 126. In an example, heatsink 126 can be over heat source 104 with a TIM 128 between heatsink 126 and heat source 104. Heat source 104 can be on a substrate 130. Substrate 130 can be coupled to PCB 132 using solder balls 134. During device assembly, active loading mechanism 106g can be configured (e.g., deformed) to generate a relatively low load on heatsink 126 and heat source 104. The relatively low load helps to reduce stress on heat source 104, TIM 128, substrate 130, PCB 132, and/or solder balls 134 and can help to reduce solder joint failure.

Figure 4B:
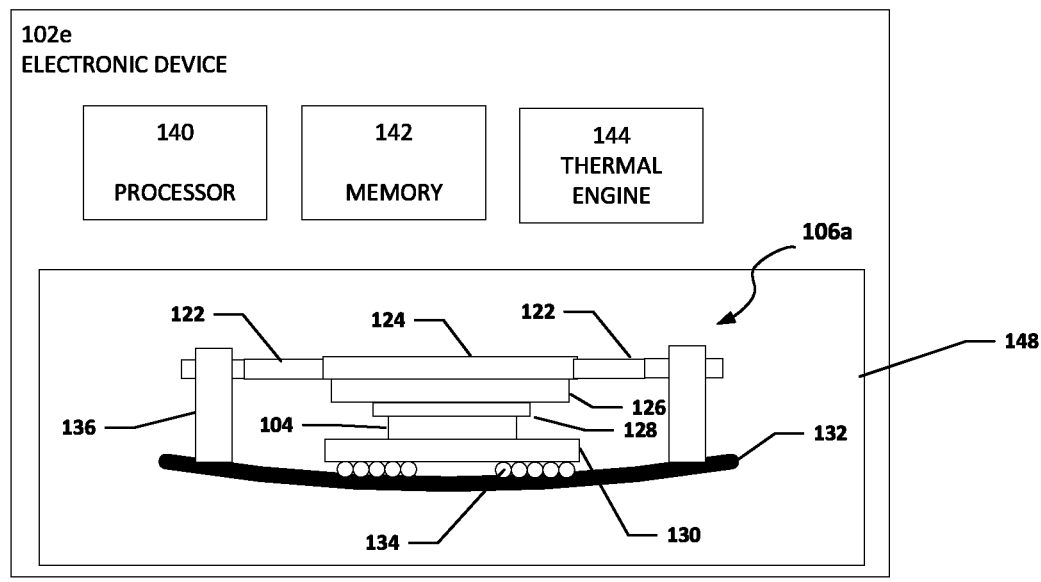
FIG. 4B is a simplified block diagram of a system to enable an active loading mechanism, in accordance with an embodiment of the present disclosure.

Turning to FIG. 4B, FIG. 4B is a simplified block diagram of electronic device 102a. Electronic device 102e can include processor 140, memory 142, thermal engine 144, and one or more electronic components 148. Each electronic component 148 can include active loading mechanism 106g. In an example, thermal engine 144 can activate active loading mechanism 106g to allow for an enabling load on heat source 104.

More specifically, during peak performance times or when a temperature of heat source 104 satisfies a threshold, a shape change of activate loading mechanism 106g is triggered by thermal engine 144. The shape change is caused by the shape memory material in activate loading mechanism 106g that changes shape at a specific temperature (a selectable property of shape memory material). The specific temperature that activates the shape memory material can be cause by electrical current running through activate loading mechanism 106g that creates resistive heating in activate loading mechanism 106a. The electrical current running through active loading mechanism 106g can be caused or triggered by thermal engine 144. As activate loading mechanism 106g attempts to revert to its programmed shape (illustrated in FIG. 2A), activate loading mechanism 106*a* is constrained by the attachments at secure posts 136 and causes a temporary bending of PCB 132 and temporarily increase of the heatsink load on heat source 104 and of the stress on TIM 128, substrate 130, PCB 132, and/or solder balls 134. The force pushing down on heatsink 126 and heat source 104 and the force pulling up or bending PCB 132 causes a pressure increase between heatsink 126 and heat source 104 and allows heatsink 126 to draw more thermal energy from heat source 104 and to help cool heat source 104.

In another example, during shock and/or vibrations of electronic component 148, a shape change of activate loading mechanism 106*g* can be triggered by thermal engine 144. When activate loading mechanism 106*g* is triggered by thermal engine 144, the force pushing down on heatsink 126 and heat source 104 and the force pulling up or bending PCB 132 can help to secure heat source 104, heatsink 126, substrate 130, and PCB 132 in the X, Y and Z direction to create a rigid body (unlike some current solutions which are held in place with spring force only). Creating the rigid body reduces oscillations between heat source 104, heatsink 126, substrate 130, and PCB 132 and reduces displacement of heatsink 126 relative to heat source 104 and PCB 132, allowing TIM 128 and solder balls 134 to withstand shock and vibration. An enclosure (e.g., a sheet metal enclosure) can seal heat source 104, heatsink 126, substrate 130, and PCB 132 and create an embedded system.

Figure 5A:
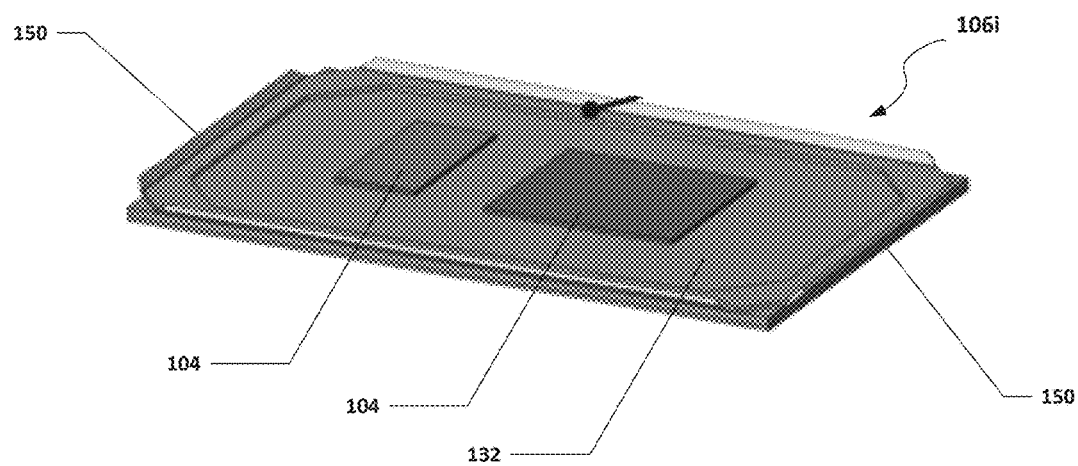
FIG. 5A is a simplified block diagram of a portion of a system to enable an active loading mechanism, in accordance with an embodiment of the present disclosure.

Turning to FIG. 5A, FIG. 5A is a simplified block diagram of an active loading mechanism 106*i* coupled to at least a portion of PCB 132. In an example, active loading mechanism 106*i* can include heatsink securing mechanism 150. Active loading mechanism 106*i* can be configured as a dual-purpose stiffener and loading mechanism that is coupled to PCB 132. Active loading mechanism 106*i* can be coupled to PCB 132 after a surface mount technology (SMT) assembly process.

Figure 5B:
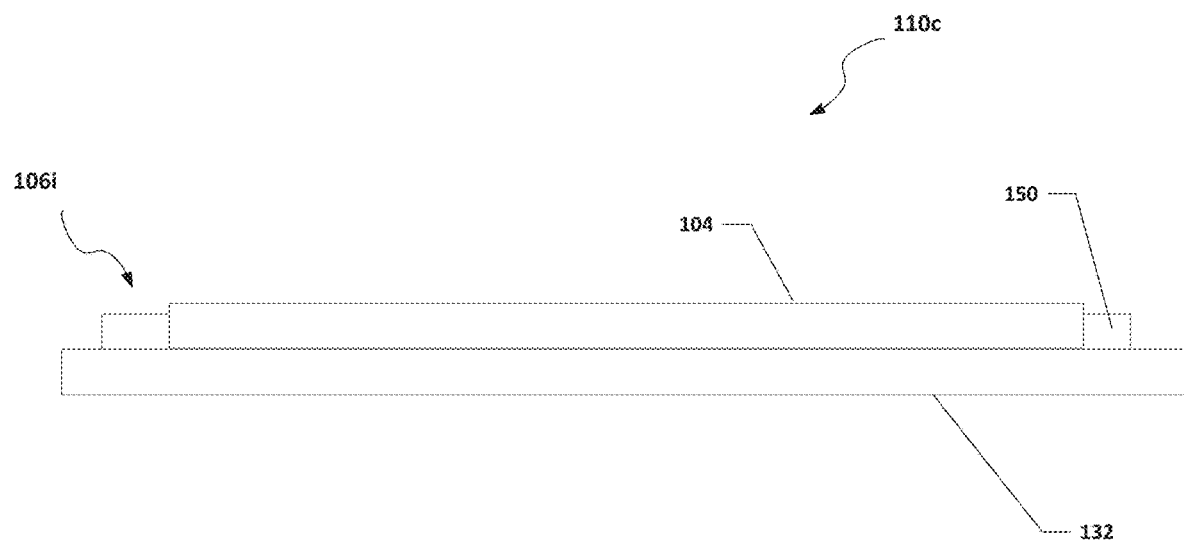
FIG. 5B is a simplified block diagram of a portion of a system to enable an active loading mechanism, in accordance with an embodiment of the present disclosure.

Turning to FIG. 5B, FIG. 5B is a simplified block diagram of an active loading mechanism 106*i* coupled to at least a portion of PCB 132. After the SMT assembly process, heatsink securing mechanism 150 may be initially flat due to the high temperature typically used during the SMT assembly process. Heatsink securing mechanism 150 can be opened or curved upward (as illustrated in FIGS. 5A and 5C) either by application of external heat or by application of an electrical current (resistive heating).

Figure 5C:
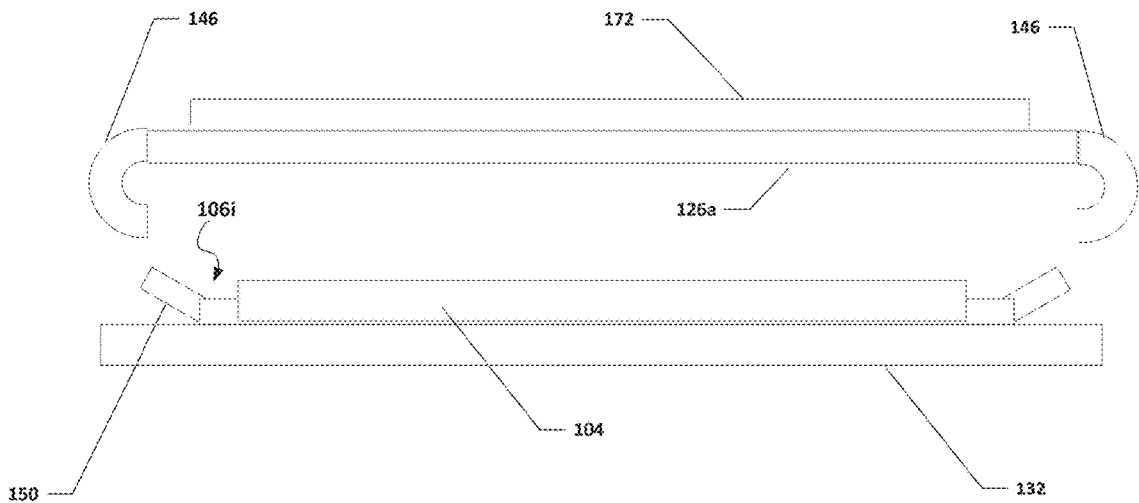
FIG. 5C is a simplified block diagram of a portion of a system to enable an active loading mechanism, in accordance with an embodiment of the present disclosure.

Turning to FIG. 5C, FIG. 5C is a simplified block diagram of an active loading mechanism 106*i* coupled to at least a portion of PCB 132. After heatsink securing mechanism 150 is opened or curved upward either by the application of external heat or by the application of an electrical current (resistive heating), heatsink 126 can be positioned over active loading mechanism 106*i*. Heatsink 126 can include one or more curved or hooked ends 146. In an example, a heat pipe 172 may be coupled to or positioned over heatsink 126. Heat pipe 172 may be an active heat pipe or a passive heat pipe.

Figure 5D:
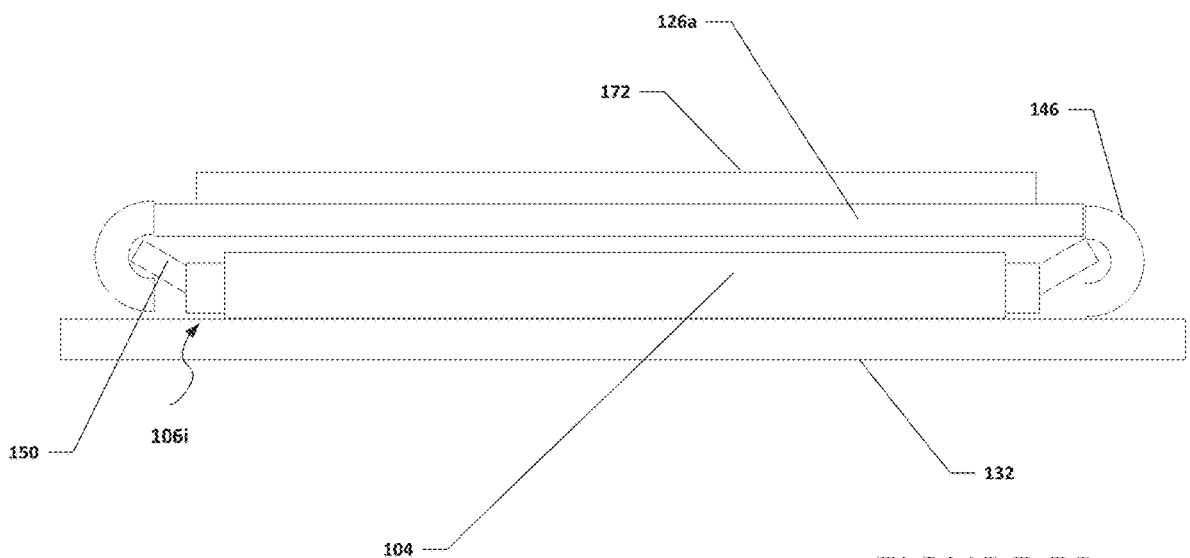
FIG. 5D is a simplified block diagram of a system to enable an active loading mechanism, in accordance with an embodiment of the present disclosure.

Turning to FIG. 5D, FIG. 5D is a simplified block diagram of an active loading mechanism 106*i* coupled to at least a portion of PCB 132. As illustrated in FIG. 5D, heatsink 126*a* can be positioned over active loading mechanism 106*i* such that heatsink securing mechanism 150 is inside curved or hooked end 146. In an example, a TIM layer (e.g., TIM 128) can be under heatsink 126*a* before heatsink 126*a* is positioned over active loading mechanism 106*i*.

Figure 5E:
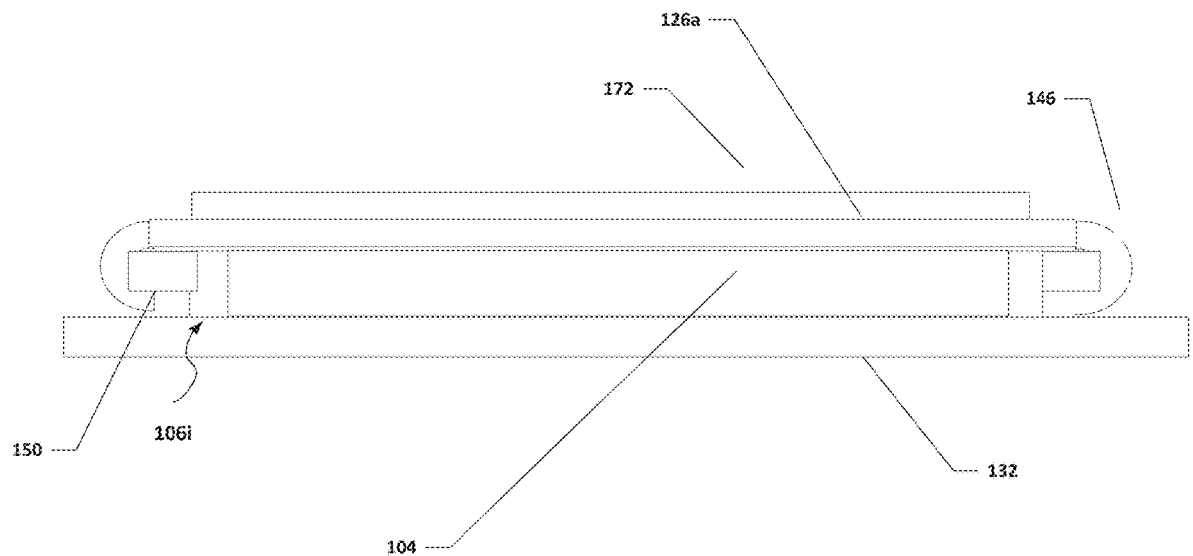
FIG. 5E is a simplified block diagram of a system to enable an active loading mechanism, in accordance with an embodiment of the present disclosure.

Turning to FIG. 5E, FIG. 5E is a simplified block diagram of an active loading mechanism 106*i* coupled to at least a portion of PCB 132. After heatsink 126*a* is positioned over active loading mechanism 106*i* such that heatsink securing mechanism 150 is inside curved or hooked end 146, heatsink securing mechanism 150 is activated. Heatsink securing mechanism 150 can be activated either by application of external heat or by application of an electrical current (resistive heating). The activation of heatsink securing mechanism 150 causes heatsink securing mechanism 150 to revert to its initial shape illustrated in FIG. 5B and pull heatsink 126*a* downward onto heat source 104 with pressure. When the external heat or electrical current is removed, heatsink securing mechanism 150 can retain its flat shape and the corresponding pressure. Heatsink 126*a* can be disassembled or removed by bending heatsink securing mechanism 150 upward and multiple assembly/disassembly operations can be performed.

Figure 6A:
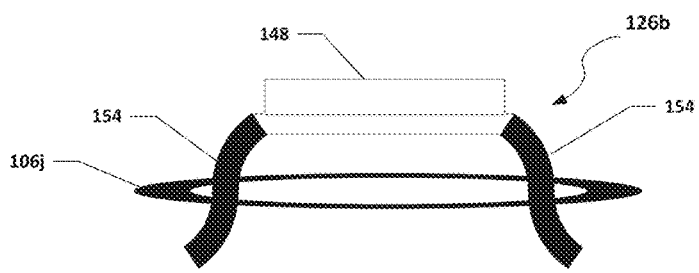
FIG. 6A is a simplified block diagram of a portion of a system to enable an active loading mechanism, in accordance with an embodiment of the present disclosure.

Turning to FIG. 6A, FIG. 6A is a simplified block diagram of an active loading mechanism 106*j* coupled to a heatsink 126*b*. In an example, heatsink 126*b* can include attachment means 154, which can consist of various geometries (e.g., rim, ledge, lip, arms, clips, teeth, etc.). Active loading mechanism 106*j* can be configured to extend around attachment means 154.

Figure 6B:
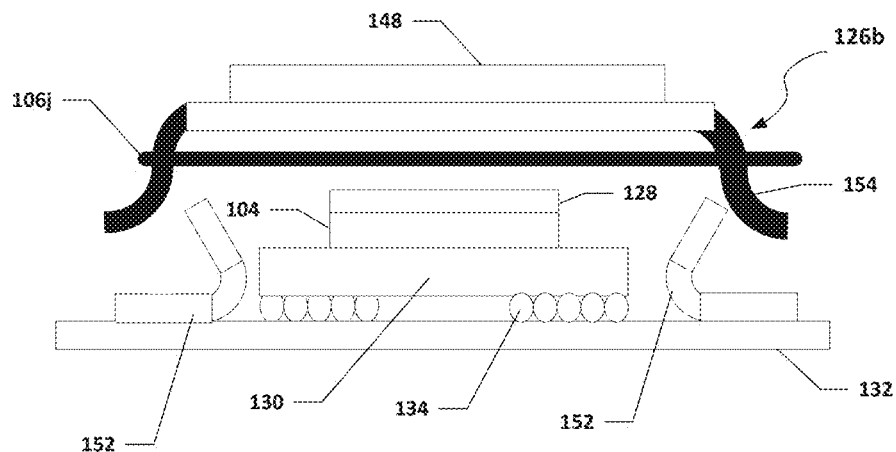
FIG. 6B is a simplified block diagram of a portion of a system to enable an active loading mechanism, in accordance with an embodiment of the present disclosure.

Turning to FIG. 6B, FIG. 6B is a simplified block diagram of active loading mechanism 106*j* coupled to heatsink 126*b*. In an example, active loading mechanism 106*j* and heatsink 126*b* can be positioned over heat source 104. Heat source 104 can be over substrate 130. Substrate 130 can be over PCB 132 and coupled to PCB 132 with solder balls 134. PCB 132 can include PCB attachment means 152. Attachment means 154 can be configured to be lowered over PCB attachment means 152, which similarly can consist of various geometries (e.g., ring, clip, posts, ledge, lip, arm, teeth, etc.).

Figure 6C:
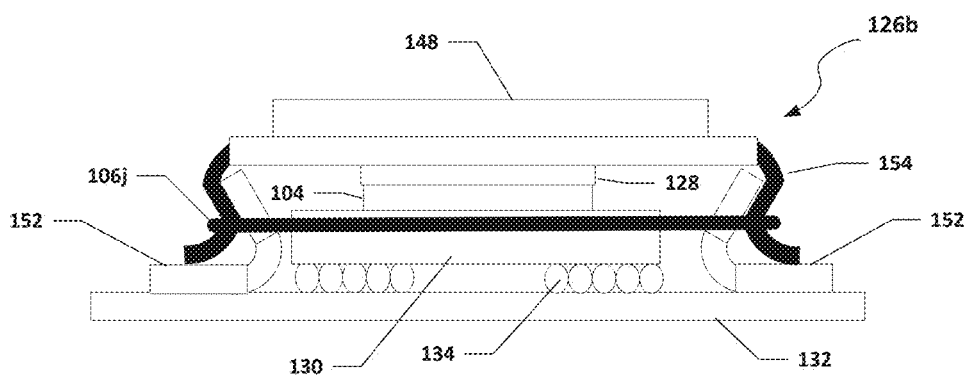
FIG. 6C is a simplified block diagram of a system to enable an active loading mechanism, in accordance with an embodiment of the present disclosure.

Turning to FIG. 6C, FIG. 6C is a simplified block diagram of active loading mechanism 106*j* coupled to heatsink 126*b*. In an example, when active loading mechanism 106*j* is activated, activate loading mechanism 106*j* pulls attachment means 154 into PCB attachment means 152 and causes a force to push heatsink 126*b* onto TIM 128 and heat source 104, due to the interaction between the sloped or cammed faces of attachment means 154 and PCB attachment means 152.

Figure 7A:
FIG. 7A is a simplified block diagram of a portion of a system to enable an active loading mechanism, in accordance with an embodiment of the present disclosure.

Turning to FIG. 7A, FIG. 7A is a simplified block diagram of an active loading mechanism 106*k*. In an example, active loading mechanism 106*k* can include securing arms 156. When not activated, securing arms 156 can have an "S" shaped profile.

Figure 7B:
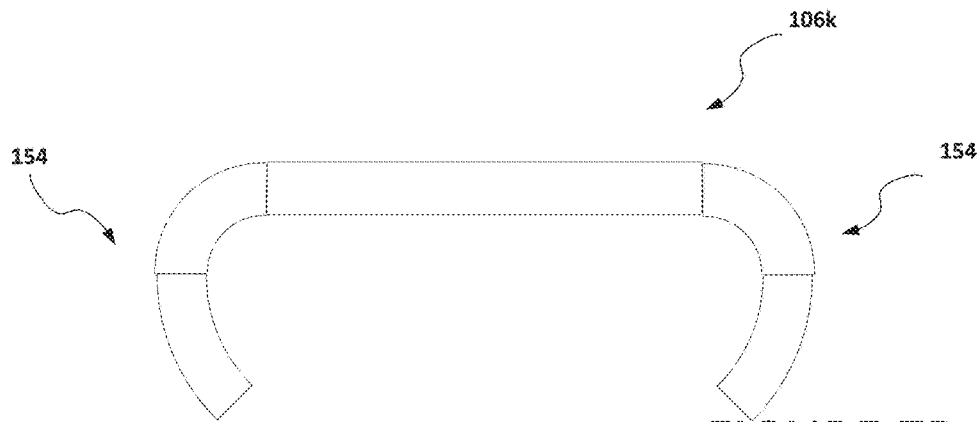
FIG. 7B is a simplified block diagram of a portion of a system to enable an active loading mechanism, in accordance with an embodiment of the present disclosure.

Turning to FIG. 7B, FIG. 7B is a simplified block diagram of active loading mechanism 106*k*. In an example, when activated, securing arms 156 can have a mirrored "C" shaped profile. Securing arms 156 can be comprised of shape memory material and may be activated by the application of external heat or by the application of an electrical current (resistive heating).

Figure 7C:
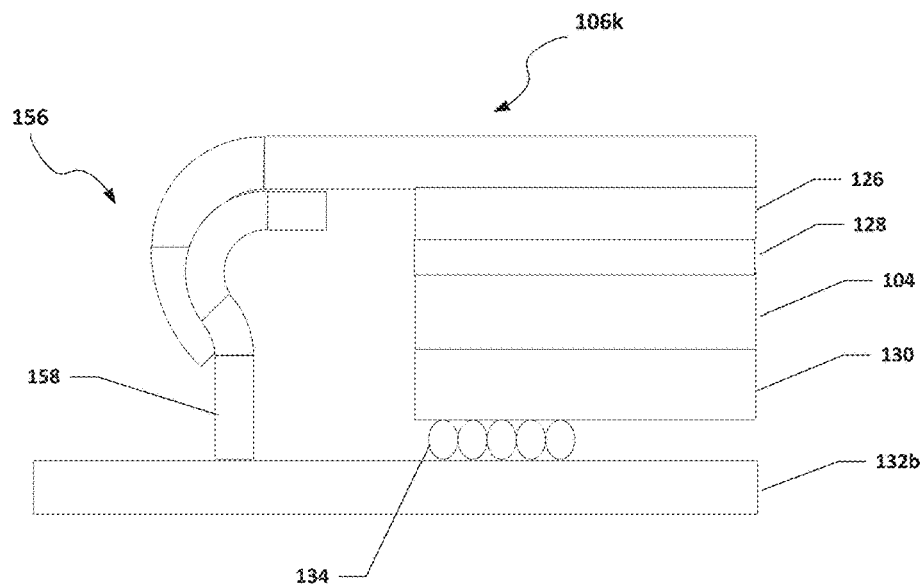
FIG. 7C is a simplified block diagram of a system to enable an active loading mechanism, in accordance with an embodiment of the present disclosure.

Turning to FIG. 7C, FIG. 7C is a simplified block diagram of active loading mechanism 106*k* over heatsink 126*b*. In an example, heatsink 126 can be positioned over TIM 128 and heat source 104 in a non-activated profile where securing arms 156 have an "S" shaped profile (as illustrated in FIG. 7A). Heat source 104 can be over substrate 130. Substrate 130 can be over PCB 132 and coupled to PCB 132 with solder balls 134. PCB 132 can include PCB securing arms 158. PCB securing arms 158 can have a profile such that when securing arms 156 are activated and transition from the "S" shaped profile illustrated in FIG. 7A to the mirrored "C" shaped profile illustrated in FIG. 7B, a downward force is applied to heatsink 126. In an example, active loading mechanism 106k may be or at least partially include an electromagnetic interference (EMI) shield that can help shield or reduce (EMI).

Figure 8A:
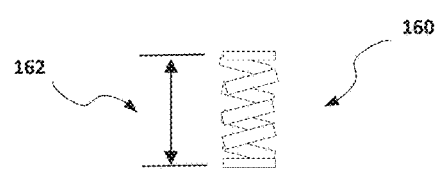
FIG. 8A is a simplified block diagram of a portion of a system to enable an active loading mechanism, in accordance with an embodiment of the present disclosure.

Turning to FIG. 8A, FIG. 8A is a simplified block diagram of memory spring 160. Memory spring 160 can have an initial programmed shape height 162. Memory spring 160 can be comprised of shape memory material and may be activated by the application of external heat or by the application of an electrical current (resistive heating).

Figure 8B:
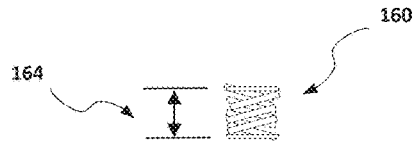
FIG. 8B is a simplified block diagram of a portion of a system to enable an active loading mechanism, in accordance with an embodiment of the present disclosure.

Turning to FIG. 8B, FIG. 8B is a simplified block diagram of memory spring 160. When sufficient compressive load is applied to memory spring 160, its length is reduced to reduced height 164 due to a combination of elastic and plastic deformation. When the shape memory material in memory spring 160 is activated, memory spring 160 reverts to its initial programmed shape height 162 illustrated in FIG. 8A.

Figure 8C:
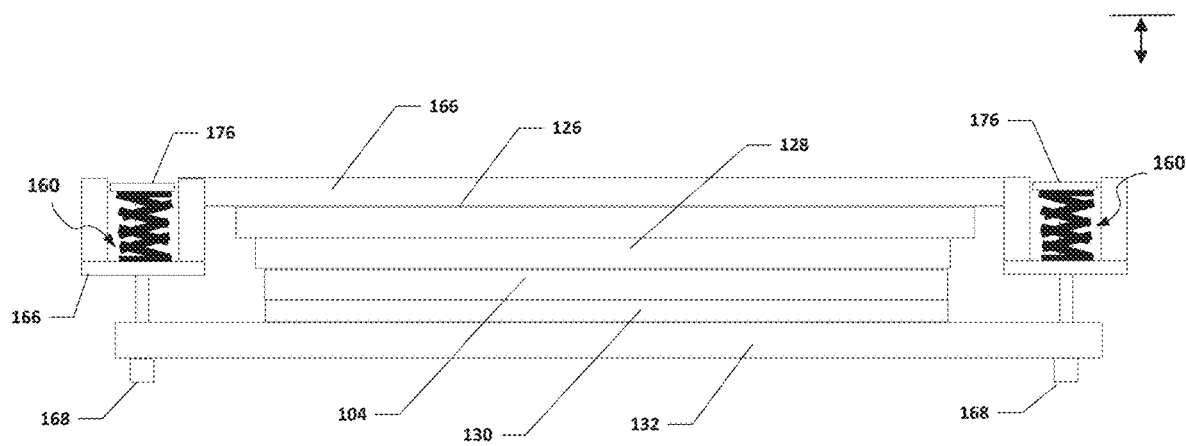
FIG. 8C is a simplified block diagram of a system to enable an active loading mechanism, in accordance with an embodiment of the present disclosure.

Turning to FIG. 8C, FIG. 8C is a simplified block diagram of memory spring 160 being used in a shoulder screw and load frame thermal attached process. In an example, a loading frame 166 can be positioned over heatsink 126, TIM 128, heat source 104, substrate 130, and PCB 132. Loading frame 166 can be secured to PCB 132 using a shoulder screw 168. Shoulder screw 168 can include a shoulder screw head 176. Memory spring 160 can be compressed (as illustrated in FIG. 8B) and positioned such that one end of memory spring 160 presses downward on load frame 166 and the other end of memory spring 160 presses upward on shoulder screw head 176. In an example, a solder ball layer can be between substrate 130 and PCB 132

Figure 8D:
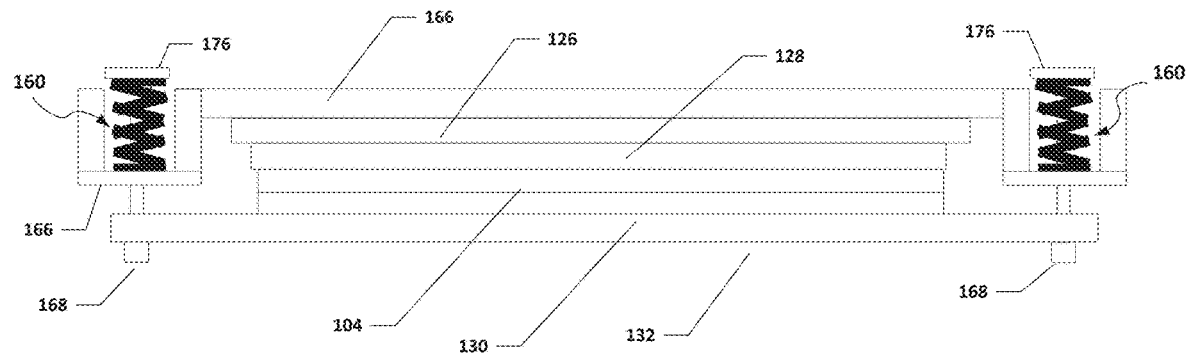
FIG. 8D is a simplified block diagram of a system to enable an active loading mechanism, in accordance with an embodiment of the present disclosure.

Turning to FIG. 8D, FIG. 8D is a simplified block diagram of memory spring 160 being used in a shoulder screw and load frame thermal attached process. In an example, the shape memory material in memory spring 160 can be activated by the application of external heat or by the application of an electrical current and upon activation, memory spring 160 attempts to revert to its initial programmed shape height 162 (as illustrated in FIG. 8A). Because memory spring 160 is compressed between load frame 166 and shoulder screw head 176, the force of memory spring 160 attempting to revert to its initial programmed shape height 162 creates or increases an applied force from heatsink 126 onto TIM 128 and heat source 104.

Figure 9A:
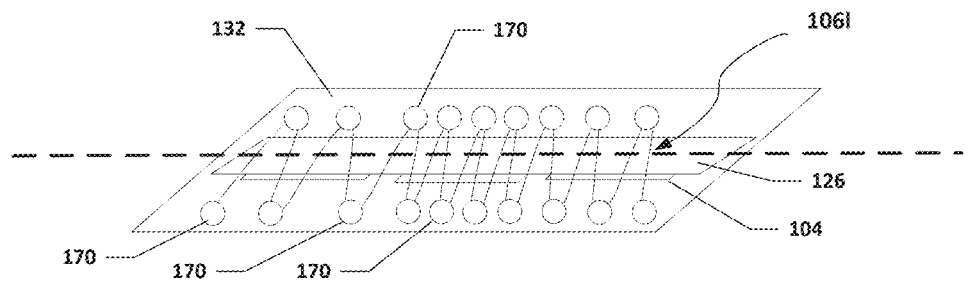
FIG. 9A is a simplified block diagram of a system to enable an active loading mechanism, in accordance with an embodiment of the present disclosure.

Turning to FIG. 9A, FIG. 9A is a simplified perspective block diagram of active loading mechanism 106l. In an example, heatsink 126 can be over one or more heat sources 104. Each heat source 104 can be over PCB 132. PCB 132 can include a plurality of shape memory material connection points 170. Active loading mechanism 106l can be over heatsink 126 and pass through at least a portion of plurality of shape memory material connection points 170 in a wire wrap or mesh type configuration. When active loading mechanism 106l is activated, the wire wrap or mesh type configuration can tighten and create loading on heatsink 126 and each of the one or more heat sources 104.

Figure 9B:
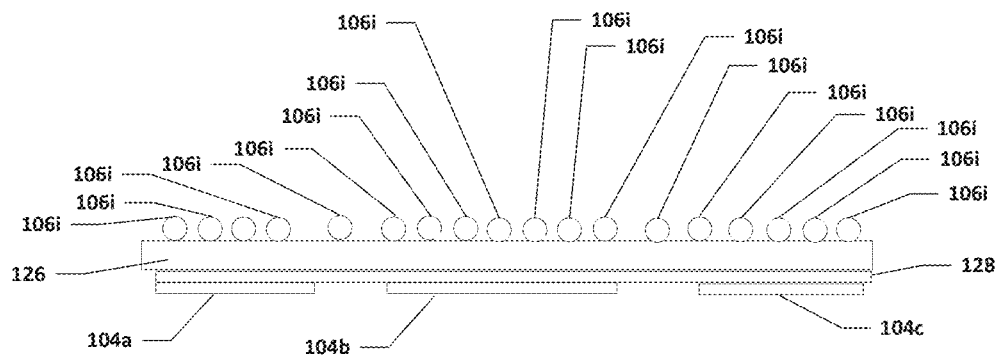
FIG. 9B is a simplified block diagram of a system to enable an active loading mechanism, in accordance with an embodiment of the present disclosure.

Turning to FIG. 9B, FIG. 9B is a simplified cutaway block diagram of active loading mechanism 106l. In an example, the wrap density or configuration of active loading mechanism 106l can vary to provide a different amount of loading on heatsink 126 and each heat source. More specifically, as illustrated in FIG. 9B, heat source 104a and heat source 104c are under a relatively low wrap density while heat source 104b is under a relatively high wrap density. When active loading mechanism 106l is activated, the loading on heat source 104b is relatively higher than the loading on heat sources 104a and 104c. In some examples, the wrap density can be increased locally (over one or more specific heat sources), and/or combined with a grooved cold plate designed to bend at specific locations, to channel the loading to specific heat sources. This can address thermal challenges caused by increased die power and/or die power density, and both thermal and mechanical tolerance challenges caused by die disaggregation and/or die-partitioning.

Figure 10:
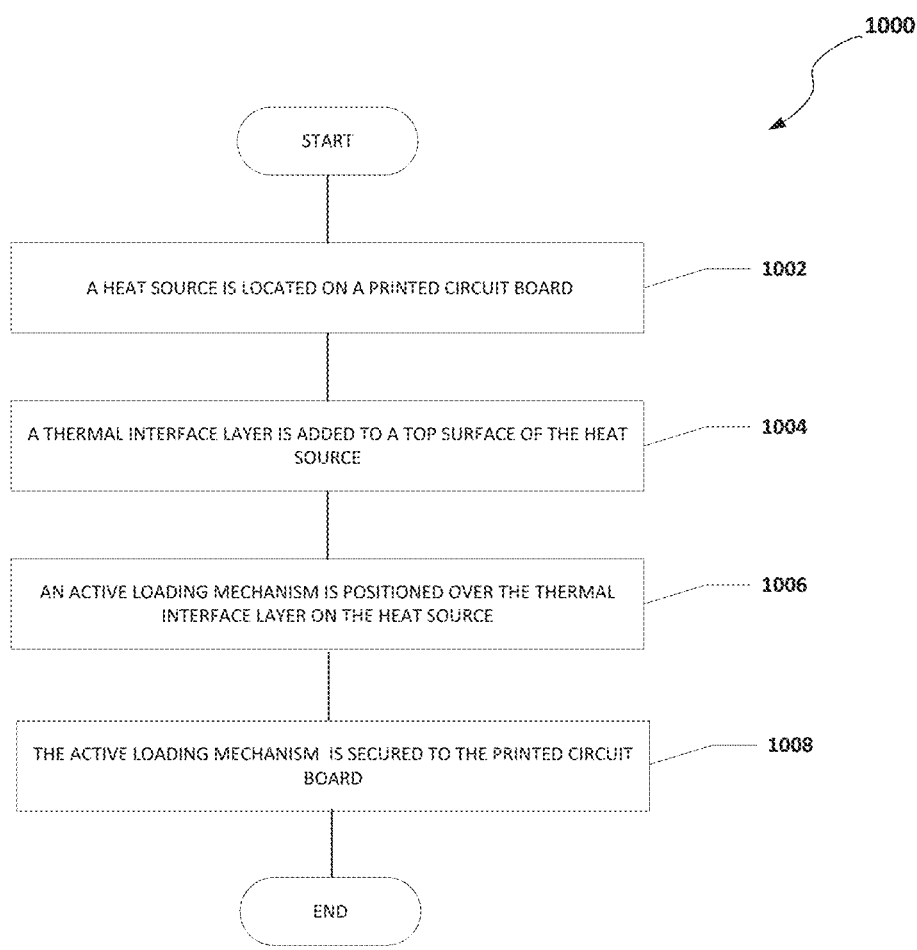
FIG. 10 is a simplified flowchart illustrating potential operations that may be associated with the system in accordance with an embodiment.

Turning to FIG. 10, FIG. 10 is an example flowchart illustrating possible operations of a flow 1000 that may be associated with enabling a disposition of a workload based on a thermal response of a device, in accordance with an embodiment. At 1002, a heat source is located on a PCB. At 1004, a TIM is added to a top surface of the heat source. At 1006, an active loading mechanism is positioned over the TIM layer on the heat source. At 1008, the active loading mechanism is secured to the PCB. For example, the active loading mechanism can be secured to the PCB as illustrated in FIG. 2, FIG. 6, FIG. 7, FIG. 8, or by some other means. In an example, the active loading mechanism includes a heatsink. In another example, an enclosure can seal the system and create an embedded system.

Figure 11:
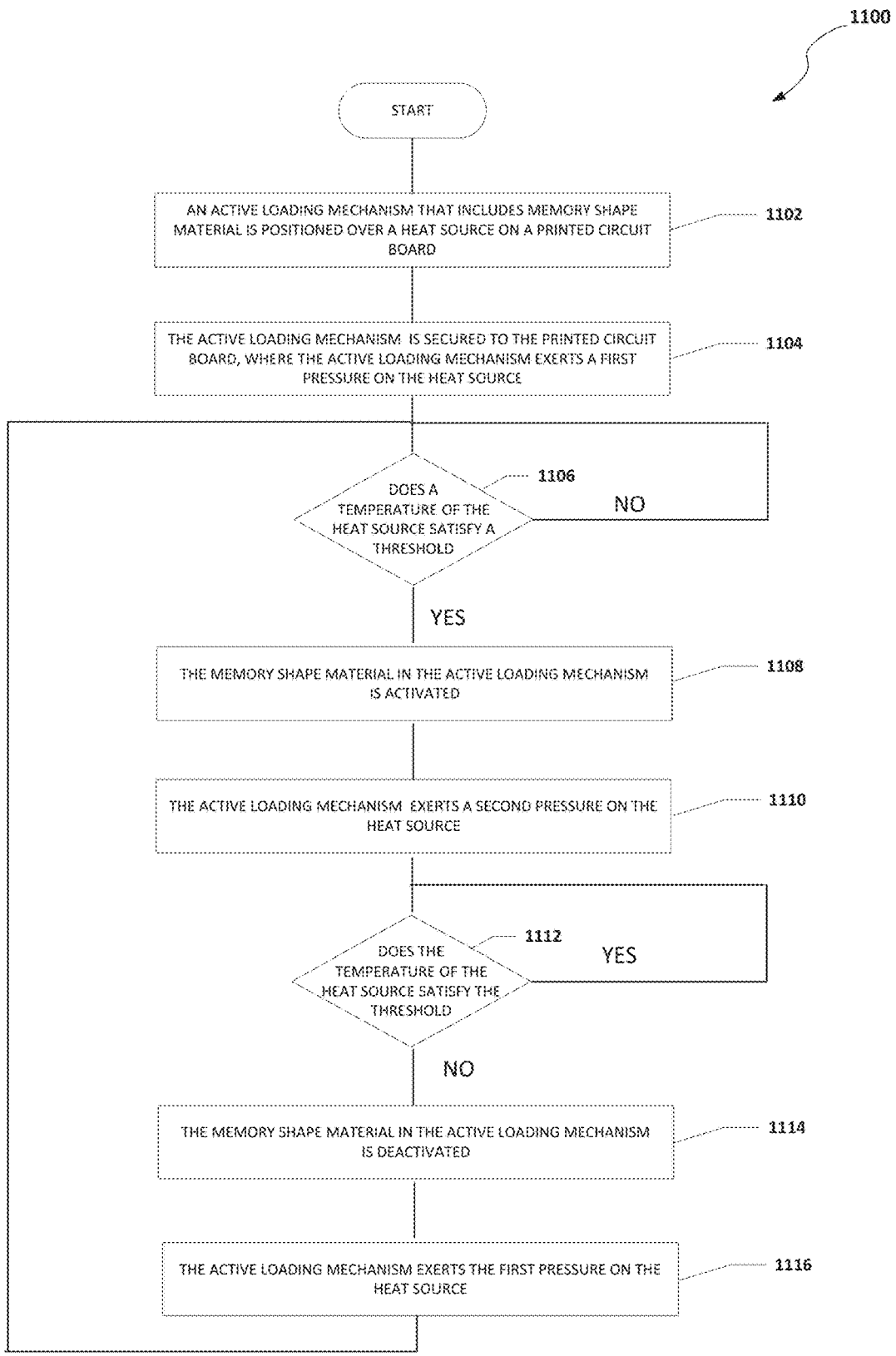
FIG. 11 is a simplified flowchart illustrating potential operations that may be associated with the system in accordance with an embodiment.

Turning to FIG. 11, FIG. 11 is an example flowchart illustrating possible operations of a flow 1100 that may be associated with enabling a disposition of a workload based on a thermal response of a device, in accordance with an embodiment. At 1102, an active loading mechanism that includes shape memory material is positioned over a heat source on a PCB. In an example, the active loading mechanism includes shape memory material. At 1104, the active loading mechanism is secured to the PCB, where there active loading mechanism exerts a first pressure or load on the heat source. In an example, the pressure or load on the heat source causes a first amount of stress on a TIM between the active loading mechanism and the heat source, a substrate under the heat source, and solder balls that coupled the substrate to the PCB, and/or the PCB. At 1106, the system determines if a temperature of the heat source satisfies a threshold. The threshold can be system dependent and may be a temperature where the heat source may undergo accelerated degradation (e.g., one hundred degrees Celsius (100° C.) for a CPU). In an example, a temperature of the shape memory material passively determines if a temperature of the heat source satisfies a threshold (e.g., the shape memory material does not activate until the shape memory material reaches the threshold temperature and the shape change starts at the $A_S$ temperature and is completed at the $A_F$ or "transition" temperature). In another example, a thermal engine (e.g., thermal engine 144) determines if a temperature of the heat source satisfies a threshold.

If the system determines the temperature of the heat source does not satisfy the threshold, then the system returns to 1106 and again determines if the temperature of the heat source satisfies the threshold. If the system determines the temperature of the heat source satisfies the threshold, then the shape memory material in the active loading mechanism is activated, as in 1108. At 1110, the active loading mechanism exerts a second pressure on the heat source. At 1112, the system determines if the temperature of the heat source satisfies the threshold. If the system determines the temperature of the heat source satisfies the threshold, then the system returns to 1112 and again determines if the temperature of the heat source satisfies the threshold. If the system determines the temperature of the heat source does not satisfy the threshold, then the shape memory material in the active loading mechanism is deactivated, as in 1114. When the shape memory material is deactivated, the shape memory material returns to its original shape. At 1116, the active loading mechanism exerts the first pressure on the heat source and the system returns to 1106 and again determines if the temperature of the heat source satisfies the threshold.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102a-102d have been illustrated with reference to particular elements and operations, these elements and operations may be replaced by any suitable architecture, protocols, and/or processes that achieve the intended functionality of electronic devices 102a-102d.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, an electronic device can include a printed circuit board, a heat source located on the printed circuit board, and an active loading mechanism secured to the printed circuit board, where the active loading mechanism is over the heat source and includes shape memory material, where the active loading mechanism applies a first load on the heat source when the shape memory material is not activated and applies a second load on the heat source when the shape memory material is activated.

In Example A2, the subject matter of Example A1 can optionally include where the active loading mechanism includes a heatsink.

In Example A3, the subject matter of any one of Examples A1-A2 can optionally include a thermal interface material between the heat source and the heatsink, where the thermal interface material is about thirty (30) micrometers in thickness.

In Example A4, the subject matter of any one of Examples A1-A3 can optionally include where the active loading mechanism is activated when a temperature of the heat source satisfies a threshold.

In Example A5, the subject matter of any one of Examples A1-A4 can optionally include where the active loading mechanism is activated by heat from the heat source.

In Example A6, the subject matter of any one of Examples A1-A5 can optionally include where the active loading mechanism is activated by resistive heating from an electrical current.

In Example A7, the subject matter of any one of Examples A1-A6 can optionally include where the shape memory material is a is Nickel-Titanium alloy.

Example M1 is a method including determining if a temperature of a heat source satisfies a threshold, where the heat source is located on a printed circuit board, and activating an active loading mechanism when the temperature of the heat source satisfies the threshold, where the active loading mechanism is over the heat source and is secured to the printed circuit board, where the active loading mechanism includes shape memory material and applies a first load on the heat source when the shape memory material is not activated and applies a second load on the heat source when the shape memory material is activated.

In Example M2, the subject matter of Example M1 can optionally include where the active loading mechanism includes a heatsink.

In Example M3, the subject matter of any one of the Examples M1-M2 can optionally include where a thermal interface material is between the heat source and the heatsink.

In Example M4, the subject matter of any one of the Examples M1-M3 can optionally include where the thermal interface material is about thirty (30) micrometers in thickness.

In Example M5, the subject matter of any one of the Examples M1-M4 can optionally include where the active loading mechanism is activated by heat from the heat source.

In Example M6, the subject matter of any one of the Examples M1-M5 can optionally include where the active loading mechanism is activated by resistive heating from an electrical current.

In Example M7, the subject matter of any one of the Examples M1-M6 can optionally include where the shape memory material is a is Nickel-Titanium alloy.

In Example M8, the subject matter of any one of the Examples M1-M7 can optionally include deactivating the active loading mechanism when the temperature of the heat source does not satisfy the threshold.

Example AA1 is an active loading mechanism. The active loading mechanism can include shape memory material, a heatsink over a heat source, and a securing mechanism, where the securing mechanism secures the active loading mechanism to a printed circuit board, where the active loading mechanism applies a first load on the heat source when the shape memory material is not activated and applies a second load on the heat source when the shape memory material is activated.

In Example AA2, the subject matter of Example AA1 can optionally include where a thermal interface material is between the heat source and the heatsink and the thermal interface material is about thirty (30) micrometers in thickness.

In Example AA3, the subject matter of any one of the Examples AA1-AA2 can optionally include where the active loading mechanism is activated when a temperature of the heat source satisfies a threshold.

In Example AA4, the subject matter of any one of the Examples AA1-AA3 can optionally include where the active loading mechanism is activated by heat from the heat source.

In Example AA5, the subject matter of any one of the Examples AA1-AA4 can optionally include where the active loading mechanism is activated by resistive heating from an electrical current.

In Example AA6, the subject matter of any one of Examples AA1-AA6 can optionally include where the shape memory material is a is Nickel-Titanium alloy.

What is claimed is:

1. An electronic device comprising:
   a printed circuit board;
   a heat source located on the printed circuit board;
   a heatsink over the heat source;

one or more secure posts secured to the printed circuit board; and an active loading mechanism, wherein the active loading mechanism includes shape memory material, wherein the active loading mechanism includes a main body over the heatsink and the shape memory material extends from the main body to the one or more secure posts, wherein the shape memory material is secured to the one or more secure posts, wherein the shape memory material applies a first load on the heat source when the shape memory material is not activated and applies a second load on the heat source when the shape memory material is activated.

2. The electronic device of claim 1, further comprising:
a thermal interface material between the heat source and the heatsink, wherein the thermal interface material is about thirty (30) micrometers in thickness.

3. The electronic device of claim 1, wherein the active loading mechanism is activated when a temperature of the heat source satisfies a threshold.

4. The electronic device of claim 1, wherein the active loading mechanism is activated by heat from the heat source.

5. The electronic device of claim 1, wherein the active loading mechanism is activated by resistive heating from an electrical current.

6. The electronic device of claim 1, wherein the shape memory material is a Nickel-Titanium alloy.

7. An active loading mechanism comprising:
shape memory material;
a heatsink over a heat source;
one or more secure posts; and
a main body, wherein the main body is over the heatsink and the shape memory material extends from the main body to the one or more secure posts, wherein the one or more secure posts secure the active loading mechanism to a printed circuit board, wherein the active loading mechanism applies a first load on the heat source when the shape memory material is not activated and applies a second load on the heat source when the shape memory material is activated.

8. The active loading mechanism of claim 7, wherein a thermal interface material is between the heat source and the heatsink and the thermal interface material is about thirty (30) micrometers in thickness.

9. The active loading mechanism of claim 7, wherein the active loading mechanism is activated when a temperature of the heat source satisfies a threshold.

10. The active loading mechanism of claim 7, wherein the active loading mechanism is activated by heat from the heat source.

11. The active loading mechanism of claim 7, wherein the active loading mechanism is activated by resistive heating from an electrical current.

12. The active loading mechanism of claim 7, wherein the shape memory material is a is Nickel-Titanium alloy.

* * * * *

UNITED STATES PATENT AND TRADEMARK OFFICE
CERTIFICATE OF CORRECTION

PATENT NO. : 10,880,986 B2
APPLICATION NO. : 16/370506
DATED : December 29, 2020
INVENTOR(S) : Evan Piotr Kuklinski et al.

It is certified that error appears in the above-identified patent and that said Letters Patent is hereby corrected as shown below:

In the Claims

In Column 18, Line 27, in Claim 12, after "a" delete "is", therefor.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*